(12) United States Patent
Mukaide

(10) Patent No.: US 6,882,698 B2
(45) Date of Patent: Apr. 19, 2005

(54) FRACTION FREQUENCY DIVIDER, INTEGRATED CIRCUIT FOR VIDEO SIGNAL, AND FRACTION FREQUENCY DIVIDING METHOD

(75) Inventor: Takanobu Mukaide, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/767,175

(22) Filed: Jan. 30, 2004

(65) Prior Publication Data

US 2004/0258193 A1 Dec. 23, 2004

(30) Foreign Application Priority Data

Jan. 31, 2003 (JP) ........................................ 2003-024853

(51) Int. Cl.[7] .............................................. H03K 21/00
(52) U.S. Cl. ........................... 377/48; 377/47; 327/115; 327/117
(58) Field of Search ..................... 377/47, 48; 327/115, 327/117

(56) References Cited

U.S. PATENT DOCUMENTS 5,224,132 A * 6/1993 Goldberg ..................... 377/48

FOREIGN PATENT DOCUMENTS

JP 2001-251181 9/2001

OTHER PUBLICATIONS

Takanobu Mukaide; Audio Clock Restoring Apparatus and Audio Clock Restoring Method; U.S. Appln. No. 10/195,437, filed Jul. 16, 2002 P. N. 6670857.

* cited by examiner

Primary Examiner—Margaret R. Wambach
(74) Attorney, Agent, or Firm—Finnegan, Henderson, Farabow, Garret & Dunner, L.L.P.

(57) ABSTRACT

In one embodiment, as an example, N/M (=3.33333 . . . ) dividing is performed assuming M=3, N=10. That is, the frequency of the input signal CK is converted to the frequency of 1/3.33333 . . . times. Here, it is assumed that the frequency dividing number is 3.33333 . . . In this case, 3(=n) dividing is combined with 4(=n+1) dividing to perform the dividing, and accordingly a signal of a desired frequency can be obtained. In response to the output DOUT of the frequency divider, an n dividing counter counts the number of performed n-dividing operations and an n+1 dividing counter counts the number of performed n+1-dividing operations. An adder outputs the frequency dividing number (n) or (n+1). A frequency divider uses the frequency dividing numbers to divide an arbitrary frequency signal CK.

7 Claims, 3 Drawing Sheets

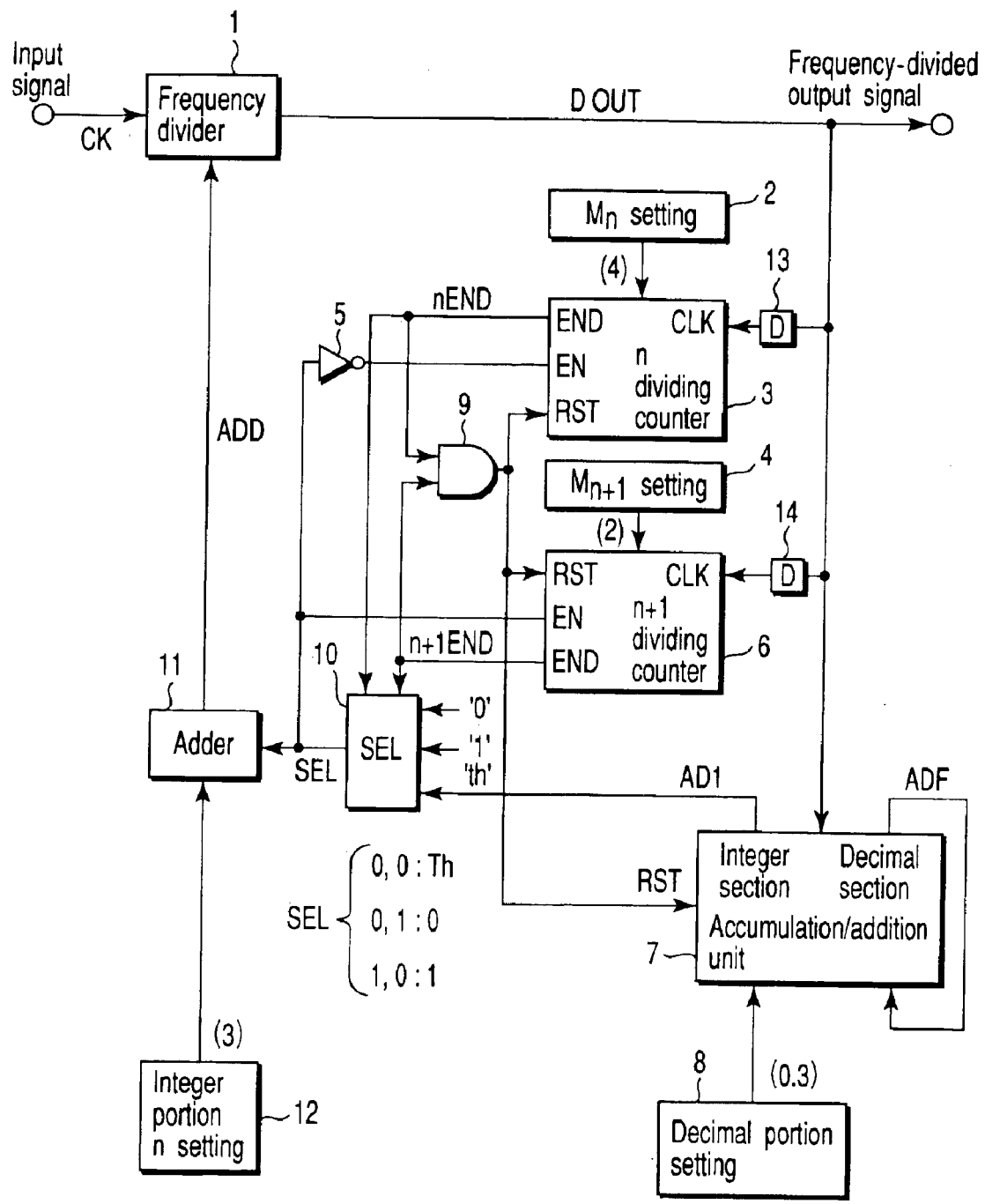
F I G. 1

FRACTION FREQUENCY DIVIDER, INTEGRATED CIRCUIT FOR VIDEO SIGNAL, AND FRACTION FREQUENCY DIVIDING METHOD

CROSS-REFERENCE TO RELATED APPLICATIONS

This application is based upon and claims the benefit of priority from the prior Japanese Patent Application No. 2003-024853, filed Jan. 31, 2003, the entire contents of which are incorporated herein by reference.

BACKGROUND OF THE INVENTION

1. Field of the Invention

The present invention relates to a dividing method of a frequency dividing number involving a decimal.

2. Description of the Related Art

In general, a frequency divider converts a frequency of an input clock signal into a frequency of one fraction of an integer. However, depending on an application of the frequency divider, a frequency divider capable of dividing the input clock signal by a frequency dividing number involving a decimal value is required in order to produce a clock signal having a desired frequency from the input clock signal having an arbitrary frequency. As this frequency divider, in Jpn. Pat. Appln. KOKAI Publication No. 2001-251181, a fraction frequency divider and fraction frequency dividing method are disclosed.

The frequency divider by the above-described publication divides frequency in a fraction (e.g., 1/5.3) including a denominator involving a decimal point, when the dividing of 1/N (N dividing) of an arbitrary frequency signal is performed. For example, the frequency divider is applied to cellular phones in a digital mobile communication system, mobile station devices such as an information terminal device including a cellular phone function and computer function, and a circuit which produces a standard frequency signal of a base band signal processing circuit in a base station device to perform radio communication with the mobile station device.

In the publication, a decimal value is set in a frequency dividing number involving a decimal point in a decimal portion setting unit, a first adder accumulates/adds the decimal value, and a holding unit holds the accumulated/added value. When the held added value is 1 or more, the holding unit outputs 1 and also outputs the decimal value obtained by subtracting 1 from the held added value as the accumulated/added value to the first adder. Furthermore, an integer value in the frequency dividing number is set to an integer portion setting unit. When the holding unit does not output 1, the frequency divider uses the integer value as the frequency dividing number to perform the dividing. When the holding unit outputs 1, the frequency divider uses the added value of 1 and the integer value as the frequency dividing number to perform the dividing. A frequency-divided signal of the frequency divider is used as an operation timing signal of the holding unit.

The fraction frequency dividing apparatus described in the Jpn. Pat. Appln. KOKAI Publication No. 2001-251181 is capable of correctly performing the dividing involving the decimal, when a valid digit of a decimal setting section is infinite. However, since a finite digit is actually used to perform the dividing, there is a problem that precision of an accumulation/addition result drops and it is impossible to perform the correct dividing. That is, in the publication, when the precision of the decimal value to be set to the decimal portion setting unit is lowered, the precision of the dividing also drops. For example, when the frequency of the input signal is converted to a frequency of 3/10 (=1/3.3333 ...) times, it is necessary to set a high-precision numeric value such as 0.33333 to the decimal portion setting unit. However, when low-precision 0.3 is set instead of the numeric value with the high precision, the input signal is converted to a frequency of 6/19 (=1/3.6666 ...) times.

BRIEF SUMMARY OF THE INVENTION

According to one aspect of the present invention, there is provided a fraction frequency divider which divides an input signal by a frequency dividing number N/M of a ratio N/M of an integer M to N involving a decimal to output a frequency-divided signal, the divider comprising: an integer setting section which sets an integer portion n of the frequency dividing number; a decimal setting section which sets a decimal portion f of the frequency dividing number; an accumulation/addition section including a decimal section which accumulates/adds a value of the decimal portion f in response to the outputted frequency-divided signal to provide a decimal value of an accumulation/addition result and an integer section to provide a carry signal; an adder which adds the value of the integer portion n of the integer setting section and the value of the integer portion of the accumulation/addition result; a dividing section which switches the frequency dividing number to a result obtained by the adder to divide the input signal and which outputs the frequency-divided signal; a dividing number setting section which sets a number Mn of n-dividing operations to be performed, and a number Mn+1 of n+1-dividing operations to be performed, the numbers being obtained from a relation of the integers M, N, and n; a counter section including a first counter which counts the number of performed n-dividing operations in response to the frequency-divided signal and a second counter which counts the number of performed n+1-dividing operations in response to the frequency-divided signal based on the carry signal of the integer section of the accumulation/addition section; and a calculation processing section which sets the integer portion of the accumulation/addition result to one of 0 and 1 in accordance with a content of one of the first and second counters and which resets the first and second counters and the accumulation/addition section in accordance with the content of the other of the first and second counters and which sets the contents of the counters and the accumulation/addition section to 0.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing a constitution of a fraction frequency divider according to one embodiment of the present invention;

DETAILED DESCRIPTION OF THE INVENTION

Figure 2:
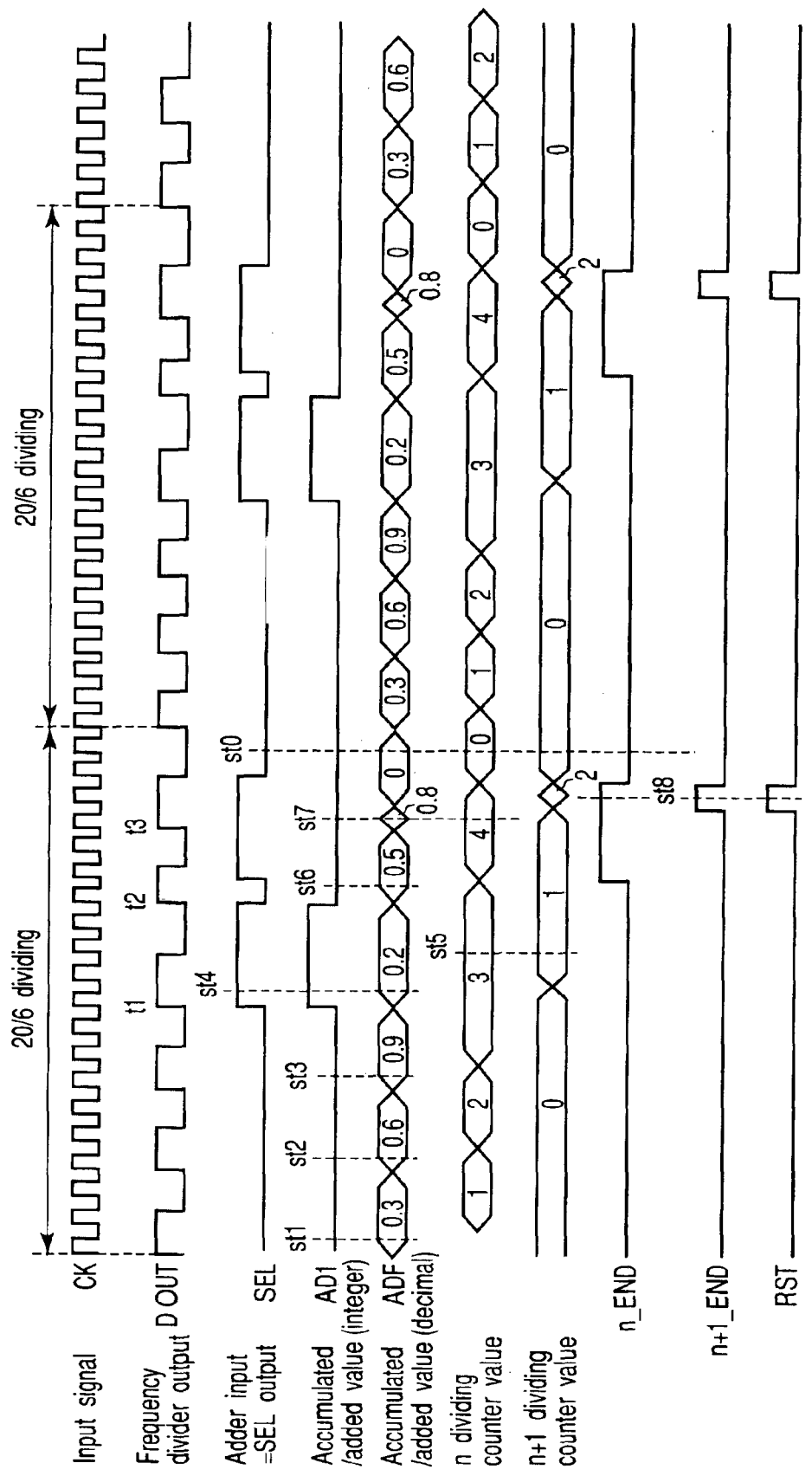
FIG. 2 is a timing chart showing an operation example of the fraction frequency divider shown in FIG. 1.

An embodiment of the present invention will be described in detail with reference to the drawings. The embodiment of the present invention will hereinafter be described, but the description does not limit an apparatus and method of the present invention.

FIG. 1 is a block diagram showing a constitution of a fraction frequency divider according to one embodiment of the present invention.

A frequency divider 1 uses an integer value ADD supplied from an adder 11 as a frequency dividing number to divide an input signal CK. Delay units 13, 14 delay an output signal DOUT of the frequency divider 1 by one period of the input signal CK. When an enable input EN indicates a logic 1, an n dividing counter 3 counts the signal DOUT at a timing delayed by one period of the input signal CK. The n dividing counter 3 outputs the logic 1 as a signal nEND, when a counted value agrees with a set value of an Mn setting section 2. When the enable input EN indicates the logic 1, an n+1 dividing counter 6 counts the signal DOUT at the timing delayed by one period of the input signal CK. The n+1 dividing counter 6 outputs the logic 1 as a signal n+1END, when the counted value agrees with the set value of an Mn+1 setting section 4.

An accumulation/addition unit 7 accumulates/adds a value set in an f setting section 8 and a decimal section output value ADF at a rising timing of the signal DOUT. When carry occurs as a result of addition, the accumulation/addition unit 7 outputs the logic 1 as an integer section output value ADI (carry signal). A selector 10 outputs one of "0", "1", "through (Th)" as a signal SEL in response to selection signals nEND and n+1END from the n dividing counter 3 and n+1 dividing counter 6. In detail, the selector 10 outputs Th as the signal SEL, when the selection signals nEND and n+1END are (0, 0). The selector outputs 0, when the signals are (0, 1). The selector outputs 1, when the signals are (1, 0). The adder 11 adds the set value of an n setting section 12 and the value of the output signal SEL of the selector 10, and supplies ADD as an addition result to the frequency divider 1.

In the present embodiment, as an example, N/M (=3.33333 . . . ) dividing is performed assuming M=3, N=10. That is, the frequency of the input signal CK is converted to the frequency of 1/3.33333 . . . times. Here, it is assumed that the frequency dividing number is 3.33333 . . . In this case, 3 dividing is combined with 4 dividing to perform the dividing, and accordingly a signal of a desired frequency can be obtained.

First, an integer portion n and decimal portion f are obtained by the following relation equation:

N/M=n.f, where n denotes an integer and f denotes a decimal numeric value.

In the present embodiment, Mn n-dividing operations are combined with Mn+1 n+1-dividing operations and performed repeatedly. The value M, the value N, the number Mn of performed n-dividing operations, and the number Mn+1 of performed n+1-dividing operations have the following relation:

$M=Mn+Mn+1$; and $N=Mn \times n+Mn+1 \times (n+1)$.

When M=3, N=10 are applied to the above equations, the following are derived:

n=3;

f=0.33333 . . . ;

Mn=2; and

Mn+1=1.

As described above, the above equations indicate that the n dividing is performed Mn times, the n+1 dividing is performed Mn+1 times, and the dividing operations are repeated. That is, it is meant that the 3-dividing is performed twice, the 4-dividing is performed once, and the dividing is repeated.

FIG. 2 is a timing chart showing an operation example of the fraction frequency divider shown in FIG. 1. ST1, ST2 . . . indicate states of a processing process.

The values derived as described above are set to sections beforehand. Here, even when the values Mn (=2), Mn+1 (=1) are set to the Mn setting section 2 and Mn+1 setting section 4, needless to say, this fraction frequency divider circuit normally operates, but the integer section of the accumulation/addition unit 7 does not indicate the logic 1 (carry does not occur), and therefore the detailed operation of the present circuit cannot be described. Therefore, for the sake of convenience of the description, the N/M (=3.33333 . . . ) dividing is assumed to be performed in which M=6, N=20. Furthermore, a numeric value having a large digit number, such as 0.33333, may also be used as the decimal portion f, but to simplify the description, 0.3 is used as the decimal portion f in the present embodiment. Even when 0.3 is used in the decimal portion f, this fraction frequency divider circuit can exactly divide the input signal. It is to be noted that arbitrary integers can be used in the values M, N.

When M=6, N=20 are applied to the above equations, the set values are as follows:

n=3;

f=0.3;

Mn=4; and

Mn+1=2.

This means that the 3 dividing is performed four times, the 4 dividing is performed twice, and the continuous dividing operations are repeated.

Therefore, the integer portion n (=3) is set to the n setting section 12, the decimal portion f (=0.3) is set to the f setting section 8, Mn (=4) is set to the Mn setting section 2, and Mn+1 (=2) is set to the Mn+1 setting section 4.

When the accumulation/addition of the decimal portion f is performed once from an initial state, output results of the accumulation/addition unit 7 are as follows (st1).

Integer section ADI: 0

Decimal section ADF: 0.3

Therefore, the output SEL of the selector 10 is 0, the adder 11 outputs the value of the n setting section 12 as such, the frequency divider 1 performs the 3 dividing, and the value of the n dividing counter 3 is slightly delayed by the delay section 13 to indicate 1. Subsequently, the accumulation/addition unit 7 accumulates/adds the decimal section ADF: 0.3 of the accumulation/addition result and the decimal portion f=0.3 of the f setting section 8 to obtain the following result (st2).

Integer section ADI: 0
Decimal section ADF: 0.6

Therefore, the output SEL of the selector 10 is 0, the adder 11 outputs the value of the n setting section 12 as such, the frequency divider 1 performs the 3 dividing, and the value of the n dividing counter 3 increases by 1. Subsequently, the accumulation/addition unit 7 accumulates/adds the decimal value ADF: 0.6 of the accumulation/addition result and the decimal portion f=0.3 of the f setting section 8 to obtain the following result (st3).

Integer section ADI: 0
Decimal section ADF: 0.9

Therefore, the output SEL of the selector 10 is 0, the adder 11 outputs the value of the n setting section 12 as such, the frequency divider 1 performs the 3 dividing, and the value of the n dividing counter 3 increases by 1 to indicate 3.

The output result of the accumulation/addition unit 7 is as follows at the next rising t1 of the frequency divider output DOUT. That is, the carry occurs here (st4).

Integer section ADI: 1
Decimal section ADF: 0.2

When the carry occurs, and the integer section ADI indicates 1, the selector 10 outputs 1 as the selection output SEL (st4). As a result, the adder 11 outputs 4, and the frequency divider 1 performs the 4 dividing. At this time, the enable input EN of the n+1 dividing counter 6 indicates the logic 1, and the enable input EN of the dividing counter 3 indicates logic 0. Therefore, the n dividing counter 3 stops the operation, and the value of the n+1 dividing counter 6 indicates 1 (st5).

The carry signal (ADI) indicates 0, and the output result of the accumulation/addition unit 7 is as follows at the next rising t2 of the frequency divider output DOUT (st6).

Integer section ADI: 0
Decimal section ADF: 0.5

When the integer section ADI indicates 0, the selector 10 outputs 0 as the selection output SEL. As a result, the adder 11 outputs 3, and the frequency divider 1 performs the 4 dividing. At this time, the enable input EN of the n+1 dividing counter 6 indicates the logic 0, and the enable input EN of the dividing counter 3 indicates the logic 1. Therefore, the n+1 dividing counter 6 stops the operation, and the value of the n dividing counter 3 increases by 1 to indicate 4. At this time, the set value 4 of the Mn setting section 2 agrees with the value of the n dividing counter 3, and the output nEND indicates the logic 1.

The output result of the accumulation/addition unit 7 indicates the following value at the next rising t3 of the frequency divider output DOUT (st7), and the value of the n+1 dividing counter 6 increases by 1 to indicate 2.

Integer section ADI: 0
Decimal section ADF: 0.8

At this time, the set value (=2) of the Mn+1 setting section 4 agrees with the value of the n+1 dividing counter 6, and the output n+1END indicates the logic 1. As a result, both inputs of an AND gate 9 satisfy the logic 1, a signal RST indicates the logic 1 (st8), the n dividing counter 3, n+1 dividing counter 6, and accumulation/addition unit 7 are reset, and the system returns to a first state (st0).

Thereafter, the above-described operation is similarly repeatedly performed. Accordingly, even when the frequency dividing number cannot be represented in a finite digit, it is possible to perform the N/M dividing with good precision. That is, it is possible to produce a good-precision fraction frequency-divided signal regardless of the decimal portion precision of the frequency dividing number.

It is to be noted that the fraction frequency divider by the present invention also operates as an integer frequency divider whose frequency dividing number is an integer, when the set value is changed. In the above-described embodiment, when the counted value of the n dividing counter 3 is Mn, the selector 10 outputs the logic 1 (fixes the integer section of the accumulation/addition unit 7 to 1). When the n+1 dividing counter 6 indicates Mn+1, the n dividing counter 3, n+1 dividing counter 6, and accumulation/addition unit 7 are reset. As a result, the integer section of the accumulation/addition unit 7 is set to 0. However, this is sometimes reversed. That is, when the counted value of the n+1 dividing counter 6 is Mn+1 in accordance with the value set to each setting section, the selector 10 outputs the logic 0 (fixes the integer section of the accumulation/addition unit 7 to 0). When the n dividing counter 3 indicates Mn, the n dividing counter 3, n+1 dividing counter 6, and accumulation/addition unit 7 are reset. As a result, the integer section of the accumulation/addition unit 7 may also be constituted to be set to 0.

Therefore, for example, a calculation processing section constituted of the AND gate 9 and selector 10 sets the integer section of the accumulation/addition unit 7 to one of 0 and 1 in accordance with the content of one of the n dividing counter 3 and n+1 dividing counter 6, resets the counters 3, 6, and accumulation/addition unit 7 in accordance with the content of the other of the counters 3, 6, and sets the contents of the counters 3, 6 and accumulation/addition unit 7 to 0.

Figure 3:
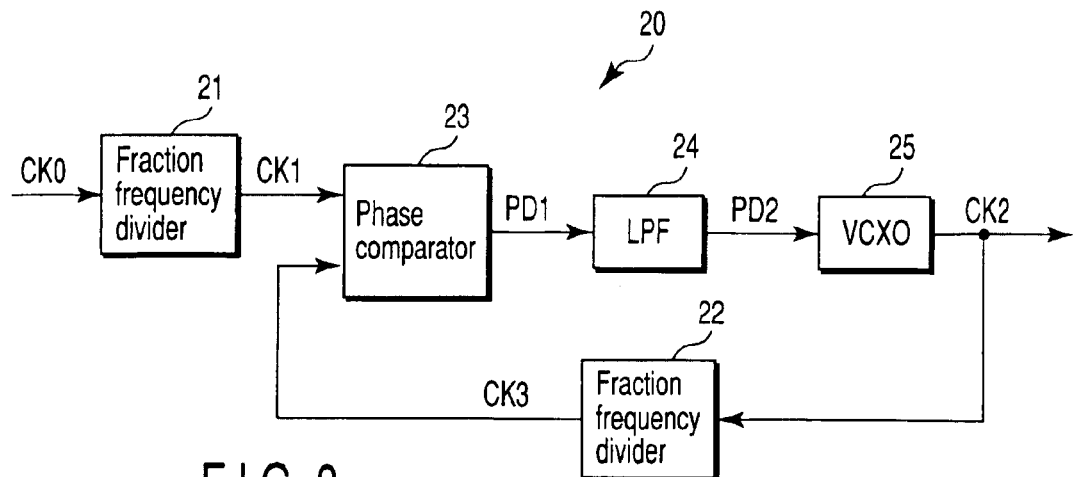
FIG. 3 is a block diagram showing a constitution of a PLL circuit using the fraction frequency divider according to the present invention.

FIG. 3 is a block diagram showing a constitution of a phase lock loop (PLL) circuit 20 using fraction frequency dividers 21, 22 according to the present invention.

The fraction frequency divider 21 divides an input clock signal CK0 as described above in the embodiment, and supplies a divided clock signal CK1 to a phase comparator 23. The phase comparator 23 detects a phase difference between the clock signal CK1 and an output clock signal CK3 of the fraction frequency divider 22 to output a phase difference signal PD1. The phase difference signal PD1 is filtered through a low pass filter (LPF) 24, and supplied as a phase difference signal PD2 to a voltage control crystal oscillator (VCXO) 25. The VCXO 25 changes the frequency of an output clock signal CK2 in accordance with the phase difference signal PD2. The clock signal CK2 is divided by the fraction frequency divider 22, and supplied as the clock signal CK3 to the phase comparator 23. As a result, the PLL circuit 20 outputs the clock signal CK2 whose period is constant.

Figure 4:
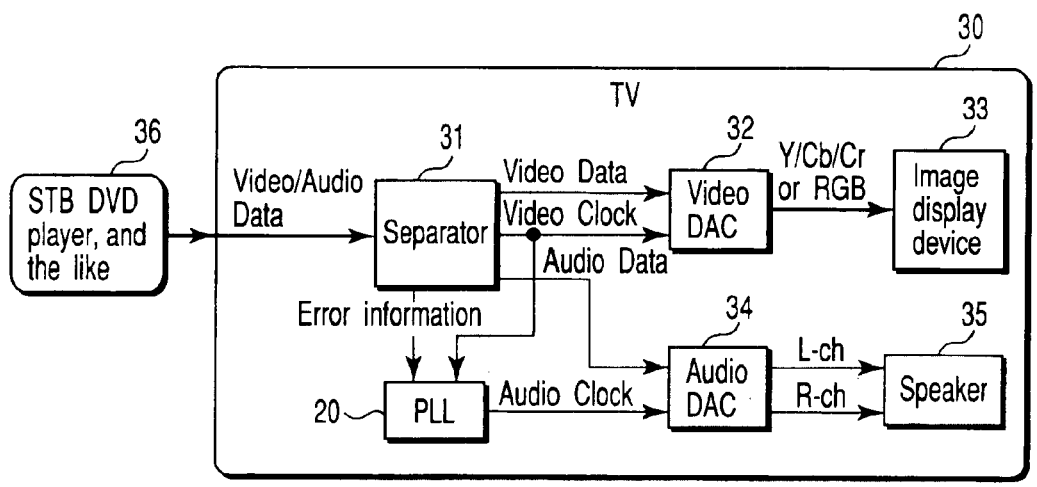
FIG. 4 is a block diagram showing a constitution of a TV receiver using the PLL circuit shown in FIG. 3.

FIG. 4 is a block diagram showing a constitution of a TV receiver 30 using the PLL circuit 20 shown in FIG. 3.

Reference numeral 36 denotes external apparatuses which provide video/audio data, such as a set top box (STB) which receives digital broadcasting, and a DVD player. A separator 31 separates a composite video signal supplied from the external apparatus 36 into video clock, video data, and audio data. The video clock is supplied to the PLL circuit 20 and a video DAC 32, the video data is supplied to the video DAC 32, the audio data is supplied to an audio DAC 34, and frequency error information is supplied to the PLL circuit 20. The PLL circuit 20 produces audio clock based on the video clock and frequency error information to supply the clock to the audio DAC 34.

The video DAC 32 DA-converts input video data at a timing of video clock, and supplies an analog video signal to an image display device 33 such as CRT and LCD. The image display device 33 displays an image corresponding to the input video signal. The audio DAC 34 DA-converts input audio data at a timing of audio clock, supplies an analog sound signal to a speaker 35, and produces sound from the speaker.

Figure 5:
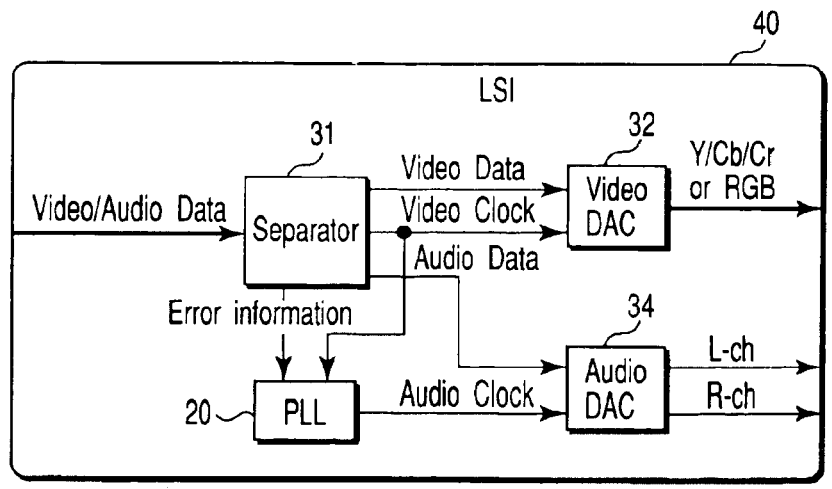
FIG. 5 is a block diagram showing a constitution of LSI40 for a video signal, in which a separator, video DAC, PLL, and audio DAC shown in FIG. 4 are integrated in one chip.

FIG. 5 shows a large scale integration circuit (LSI) 40 in which the separator 31, video DAC 32, PLL circuit 20, and audio DAC 34 shown in FIG. 4 are integrated in one chip. By this integration in one chip, a design cost of AV apparatus is reduced, and the fraction frequency divider according to the present invention can inexpensively be applied to various AV apparatuses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A fraction frequency divider which divides an input signal by a frequency dividing number N/M of a ratio N/M of an integer M to N involving a decimal to output a frequency-divided signal, the divider comprising:

an integer setting section which sets an integer portion n of the frequency dividing number;

a decimal setting section which sets a decimal portion f of the frequency dividing number;

an accumulation/addition section including a decimal section which accumulates/adds a value of the decimal portion f in response to the outputted frequency-divided signal to provide a decimal value of an accumulation/addition result and an integer section to provide a carry signal;

an adder which adds the value of the integer portion n of the integer setting section and the value of an integer portion of the accumulation/addition result;

a dividing section which switches the frequency dividing number to a result obtained by the adder to divide the input signal and which outputs the frequency-divided signal;

a dividing number setting section which sets a number Mn of n-dividing operations to be performed, and a number Mn+1 of n+1-dividing operations to be performed, these numbers being obtained from a relation of the integers M, N, and n;

a counter section including a first counter which counts the number of performed n-dividing operations in response to the frequency-divided signal and a second counter which counts the number of performed n+1-dividing operations in response to the frequency-divided signal based on the carry signal of the integer section of the accumulation/addition section; and a calculation processing section which sets the integer portion of the accumulation/addition result to one of 0 and 1 in accordance with a content of one of the first and second counters and which resets the first and second counters and the accumulation/addition section in accordance with the content of the other of the first and second counters and which sets the contents of the counters and the accumulation/addition section to 0.

2. The fraction frequency divider according to claim 1, wherein the calculation processing section sets the integer portion of the accumulation/addition result to 1, when the content of the first counter is Mn, and resets the first and second counters and the accumulation/addition section and sets the contents of the counters and the accumulation/addition section to 0, when the second counter indicates Mn+1.

3. The fraction frequency divider according to claim 1, wherein the dividing number setting section obtains the number Mn of n-dividing operations to be performed and the number Mn+1 of n+1-dividing operations to be performed by the following equations:

$N/M = n.f$;

$M = Mn + Mn+1$; and $N = Mn \times n + Mn+1 \times (n+1)$, where n denotes an integer and f denotes a decimal numeric value.

4. The fraction frequency divider according to claim 2, wherein the dividing number setting section obtains the number Mn of n-dividing operations to be performed and the number Mn+1 of n+1-dividing operations to be performed by the following equations:

$N/M = n.f$;

$M = Mn + Mn+1$; and $N = Mn \times n + Mn+1 \times (n+1)$, where n denotes an integer and f denotes a decimal numeric value.

5. A large scale integration circuit for a video signal, comprising: a phase lock loop circuit which uses a phase lock loop to produce an audio clock for digital/analog-converting audio data from a video clock separated from an inputted composite video signal, wherein the phase lock loop circuit includes a frequency divider which divides an input clock signal, and the frequency divider divides an input signal by a frequency dividing number N/M of a ratio N/M of an integer M to N involving a decimal to output a frequency-divided signal, and comprises:

an integer setting section which sets an integer portion n of the frequency dividing number;

a decimal setting section which sets a decimal portion f of the frequency dividing number;

an accumulation/addition section including a decimal section which accumulates/adds a value of the decimal portion f in response to the outputted frequency-divided signal to provide a decimal value of an accumulation/addition result and an integer section to provide a carry signal;

an adder which adds the value of the integer portion n of the integer setting section and the value of an integer portion of the accumulation/addition result;

a dividing section which switches the frequency dividing number to a result obtained by the adder to divide the input signal and which outputs the frequency-divided signal;

a dividing number setting section which sets a number Mn of n-dividing operations to be performed, and a number Mn+1 of n+1-dividing operations to be performed, these numbers being obtained from a relation of the integers M, N, and n;

a counter section including a first counter which counts the number of performed n-dividing operations in response to the frequency-divided signal and a second counter which counts the number of performed n+1-dividing operations in response to the frequency-divided signal based on the carry signal of the integer section of the accumulation/addition section; and a calculation processing section which sets the integer portion of the accumulation/addition result to one of 0 and 1 in accordance with a content of one of the first and second counters and which resets the first and second counters and the accumulation/addition section in accordance with the content of the other of the first and second counters and which sets the contents of the counters and the accumulation/addition section to 0.

6. The large scale integration circuit for the video signal according to claim 5, wherein the calculation processing section sets the integer portion of the accumulation/addition result to 1, when the content of the first counter is Mn, and resets the first and second counters and the accumulation/addition section and sets the contents of the counters and the accumulation/addition section to 0, when the second counter indicates Mn+1.

7. A method of dividing an input signal by a frequency dividing number of a ratio N/M of an integer M to N involving a decimal to output a frequency-divided signal, the method comprising:

setting an integer portion n of the frequency dividing number;

setting a decimal portion f of the frequency dividing number;

accumulating/adding a value of the decimal portion f in response to the frequency-divided signal to provide a decimal value of an accumulation/addition result as a decimal portion and to provide a carry signal as an integer portion;

adding the value of the set integer portion n and the value of the integer portion of the accumulation/addition result to provide an added value of an integer;

using the added value of the integer as a frequency dividing number to divide the input signal;

setting a number Mn of n-dividing operations to be performed, and a number Mn+1 of n+1-dividing operations to be performed, obtained from a relation of the integers M, N, and n;

counting the number of performed n-dividing operations in response to the frequency-divided signal by a first counter, and counting the number of performed n+1-dividing operations in response to the frequency-divided signal by a second counter based on the value of the integer portion of the accumulation/addition result; and fixing the integer portion of the accumulation/addition result to 1, when the number of performed n-dividing operations is Mn, and resetting the first and second counters and the decimal portion and integer portion of the accumulation/addition result and setting the contents of the counters and the accumulation/addition section to 0, when the number of performed n+1-dividing operations is Mn+1.

* * * * *